(12) United States Patent
Nagai et al.

(10) Patent No.: US 10,381,034 B2
(45) Date of Patent: Aug. 13, 2019

(54) IN-LINE TYPE FILM FORMING APPARATUS AND METHOD OF MANUFACTURING MAGNETIC RECORDING MEDIUM USING THE SAME

(71) Applicant: SHOWA DENKO K.K., Minato-ku, Tokyo (JP)

(72) Inventors: Seiya Nagai, Ichihara (JP); Satoru Ueno, Chiba (JP)

(73) Assignee: SHOWA DENKO K.K., Tokyo (JP)

( * ) Notice: Subject to any disclaimer, the term of this patent is extended or adjusted under 35 U.S.C. 154(b) by 640 days.

(21) Appl. No.: 14/533,487

(22) Filed: Nov. 5, 2014

(65) Prior Publication Data
US 2015/0125597 A1     May 7, 2015

(30) Foreign Application Priority Data

Nov. 7, 2013   (JP) ................. 2013-231378

(51) Int. Cl.
*G11B 5/85* (2006.01)
*C23C 14/56* (2006.01)
(Continued)

(52) U.S. Cl.
CPC ............ *G11B 5/851* (2013.01); *C23C 14/568* (2013.01); *C23C 14/5806* (2013.01); *G11B 5/85* (2013.01); *C23C 14/56* (2013.01); *C23C 14/566* (2013.01)

(58) Field of Classification Search
None
See application file for complete search history.

(56) References Cited

U.S. PATENT DOCUMENTS 3,976,330 A * 8/1976 Babinski ................ B65G 51/03
406/84
5,215,420 A    6/1993 Hughes et al.
(Continued)

FOREIGN PATENT DOCUMENTS

JP      11-145246 A    5/1999
JP   2000-273615 A   10/2000
(Continued)

OTHER PUBLICATIONS

Communication dated Nov. 16, 2016 from the Intellectual Property Office of Singapore in counterpart Application No. 10201407280R.
(Continued)

*Primary Examiner* — Karla A Moore
(74) *Attorney, Agent, or Firm* — Sughrue Mion, PLLC

(57) ABSTRACT

Provided is an in-line type film forming apparatus including a processing chamber which is disposed to deviate from a closed path and is connected to a corner chamber, a first loading and unloading unit which unloads a substrate from a carrier and moves the substrate to the inside of the processing chamber, a second loading and unloading unit which unloads the substrate processed in the processing chamber and loads the substrate on the carrier, and a control device which performs control of driving the first and second loading and unloading units to unload the substrate from the carrier and to move the substrate to the inside of the processing chamber, and to take out the substrate processed in the processing chamber in advance from the processing chamber and to load the substrate on the carrier.

6 Claims, 8 Drawing Sheets

(51) Int. Cl.
*C23C 14/58* (2006.01)
*G11B 5/851* (2006.01)

(56) References Cited

U.S. PATENT DOCUMENTS

| | | | |
|---|---|---|---|
| 5,846,328 A | 12/1998 | Aruga et al. | |
| 6,251,232 B1* | 6/2001 | Aruga | C23C 14/50 118/503 |
| 6,517,691 B1* | 2/2003 | Bluck | C23C 14/568 118/719 |
| 6,572,934 B2* | 6/2003 | Watanabe | C23C 14/352 427/130 |
| 7,625,450 B2* | 12/2009 | Furukawa | C23C 14/568 118/632 |
| 2001/0010204 A1* | 8/2001 | Takeyama | C23C 14/568 118/50 |
| 2004/0252624 A1 | 12/2004 | Murakami et al. | |
| 2009/0151634 A1 | 6/2009 | Watanabe et al. | |
| 2009/0308317 A1 | 12/2009 | Sone et al. | |
| 2011/0052349 A1* | 3/2011 | Sone | B25J 9/042 414/226.01 |
| 2011/0263065 A1 | 10/2011 | Black et al. | |

FOREIGN PATENT DOCUMENTS

| | | |
|---|---|---|
| JP | 2001-216633 A | 8/2001 |
| JP | 2002-288888 A | 10/2002 |
| JP | 2007-227822 A | 9/2007 |
| JP | 2008-285698 A | 11/2008 |
| JP | 2009-538540 A | 11/2009 |
| JP | 2010-135049 A | 6/2010 |
| JP | 2011-108337 A | 6/2011 |
| JP | 2011-137242 A | 7/2011 |
| JP | 2012-255207 A | 12/2012 |
| WO | 01/83843 A1 | 11/2001 |
| WO | 2007/139896 A2 | 12/2007 |

OTHER PUBLICATIONS

Communication dated May 9, 2017 from the Japanese Patent Office in counterpart application No. 2013- 231378.

* cited by examiner

IN-LINE TYPE FILM FORMING APPARATUS AND METHOD OF MANUFACTURING MAGNETIC RECORDING MEDIUM USING THE SAME

BACKGROUND OF THE INVENTION

Field of the Invention

The present invention relates to an in-line type film forming apparatus that performs a film forming process while sequentially transporting a substrate that is a film forming target in a plurality of vacuum chambers, and a method of manufacturing a magnetic recording medium using the same.

Priority is claimed on Japanese Patent Application No. 2013-231378, filed on Nov. 7, 2013, the content of which is incorporated herein by reference.

Description of Related Art

Recently, in a field of a magnetic recording medium that is used in a hard disk drive and the like, an improvement in a recording density is significant, and particularly, recently, the recording density has increased at a speed as astounding as 1.5 times per year. However, it is difficult to make miniaturization of a grain size, a thermo-stable characteristic, and a recording characteristic compatible with each other. That is, it is difficult to realize high-density of a medium due to the problem of this so-called trilemma.

A thermally assisted magnetic recording method is expected as a method of solving the trilemma, and research and development thereof have been actively in progress. The thermally assisted magnetic recording method is a recording method of performing recording by irradiating a medium with rear-field light by a magnetic head to locally heat a medium surface and to reduce a coercive force of the medium.

For example, the magnetic recording medium has a structure in which a seed film, an underlying film, a magnetic recording film, a protective film, and a lubricant film are sequentially laminated on both surfaces or a single surface of a non-magnetic substrate, and is typically manufactured by using an in-line type film forming apparatus that performs a film forming process while sequentially transporting a substrate, which is held by a carrier, between a plurality of vacuum chambers (for example, refer to Japanese Unexamined Patent Application, First Publication No. 2002-288888).

The in-line type film forming apparatus has a structure in which a plurality of vacuum chambers that perform a film forming process are connected to each other through a gate valve. In addition, in each of the chambers, a plurality of bearings that are rotatably supported in the horizontal axis direction are arranged and provided in a transportation direction of the carrier, and thus the carrier can move on the plurality of bearings.

In the in-line type film forming apparatus, the respective vacuum chambers are isolated by the gate valve, and then the vacuum chamber is decompressed. According to this, the film forming process can be performed in a state in which the inside of each of the vacuum chambers is set to an independent pressure condition.

The magnetic recording medium can be continuously manufactured by using the in-line type film forming apparatus. A substrate is not contaminated during handling of the substrate to be processed. Furthermore, a handling process is reduced, and thus a manufacturing process becomes efficient. In addition, a yield ratio is improved, and thus productivity of the magnetic recording medium can be increased.

SUMMARY OF THE INVENTION

However, in a case of manufacturing the thermally assisted magnetic recording medium, after forming the underlying layer, the substrate is heated to approximately 650° C. to form a magnetic layer, and then, it is necessary for the substrate to be cooled to approximately 250° C. to form a diamond like carbon (DLC) film as a protective film. This is because when the substrate is not cooled to the temperature, a high-quality DLC film is not formed. Here, when cooling the substrate, which is heated to 650° C., to 250° C., it takes at least one minute to two minutes in a decompressed chamber in which thermal conduction is small. However, when manufacturing a typical magnetic recording medium by using the in-line type film forming apparatus of the related art, time taken to perform the film forming process in each chamber is typically approximately 10 seconds to 20 seconds. According to this, when manufacturing the thermally assisted magnetic recording medium by using the in-line type film forming apparatus of the related art, a cooling process becomes a rate-limiting factor, and thus if a processing time of other processes is set to a processing time of the cooling process, productivity greatly decreases. In addition, in a method in which the cooling process is performed in a plurality of chambers, and the processing time of other processes is retained similar to the related art, uselessness occurs in consideration of an apparatus construction.

In addition, in the in-line type film forming apparatus of the related art, it is necessary to make a processing time equal in respective chambers. For example, in a case where the processing time in the respective chambers is set to 15 seconds, when performing a process for 90 seconds with the apparatus, it is necessary for the same process to be performed in six continuous chambers in a divided manner. In this case, one process is performed in a plurality of chambers in a divided manner, and thus there is a problem that a film becomes a multi-layer film in addition to a problem that the number of chambers of the in-line type film forming apparatus increases and thus the price of the apparatus increases. The problem related to the multi-layer film is caused by the following problem. That is, it is difficult to make film forming conditions completely the same in the plurality of chambers.

The invention has been made in consideration of the above-described circumstances, and an object thereof is to provide an in-line type film forming apparatus and a method of manufacturing a magnetic recording medium which are capable of coping with advanced film forming conditions and are suitable for mass production.

To accomplish the above-described object, the invention employs the following configurations.

(1) According to an aspect of the invention, there is provided an in-line type film forming apparatus including: a plurality of chambers which are connected to form a closed path and perform a film forming process; a carrier which holds a substrate, which is a film forming target, in the connected chambers; a transportation path which forms a closed path provided inside the connected chambers; a transportation device which sequentially transports the carrier between the plurality of chambers along the transportation path; a processing chamber which is disposed to deviate from the closed path, which is directly or indirectly connected to any chamber of the plurality of chambers, and which processes the substrate; a first loading and unloading unit which unloads the substrate from the carrier, and moves the substrate to the inside of the processing chamber; a second loading and unloading unit which takes out the substrate processed in the processing chamber from the processing chamber, and loads the substrate on the carrier; and a control device which performs control of allowing the carrier to sequentially move to chambers on a downstream side on the transportation path, and allowing a film forming process to be performed with respect to the substrate. The control device drives the first and second loading and unloading units to unload the substrate from the carrier and to move the substrate to the inside of the processing chamber, and drives the first and second loading and unloading units to take out the substrate, which is processed in advance in the processing chamber, from the processing chamber and to load the substrate on the carrier.

(2) In the aspect of the in-line type film forming apparatus stated in the above (1), the processing chamber may include a cooling unit which cools down the substrate.

(3) In the aspect of the in-line type film forming apparatus stated in the above (1) or (2), the first loading and unloading unit, which unloads the substrate from the carrier and moves the substrate to the inside of the processing chamber, and the second loading and unloading unit, which takes out the processed substrate from the processing chamber and loads the substrate on the carrier, may be the same unit.

(4) In the aspect of the in-line type film forming apparatus stated in the above any one of (1) to (3), the closed path may have a rectangular shape, and the processing chamber may be directly or indirectly connected to a connection corner chamber which is a corner chamber disposed at a corner of the rectangular closed path.

(5) In the aspect of the in-line type film forming apparatus stated in the above (4), the processing chamber may be connected to the connection corner chamber through a sub-chamber, the sub-chamber may include an extended transportation path which is extended from the transportation path in the connection corner chamber, the connection corner chamber and the sub-chamber may include an auxiliary transportation path which is provided in parallel with the extended transportation path, and the control device may drive the first and second loading and unloading units to unload the substrate from the carrier disposed on the extended transportation path or the auxiliary transportation path, and to move the substrate to the inside of the processing chamber, and may drive the first and second loading and unloading units to load the substrate processed in advance in the processing chamber on the carrier disposed on one of the extended transportation path and the auxiliary transportation path.

(6) In the aspect of the in-line type film forming apparatus stated in the above any one of (1) to (5), the closed path may have a rectangular shape, and the processing chamber may be directly or indirectly connected to a chamber that is disposed between corner chambers disposed at corners of the rectangular closed path.

(7) According to another aspect of the invention, there is provided a method of manufacturing a magnetic recording medium by using the in-line type film forming apparatus according to any one of (1) to (6). The method includes at least: a step of sequentially moving the carrier to the chambers on the transportation path, and forming a multi-layer film on a non-magnetic substrate; and a step of unloading the substrate from the carrier before the formation of the multi-layer film, after the formation of the multi-layer film, or during the formation of the multi-layer film, moving the substrate to the processing chamber, and processing the substrate in the processing chamber.

(8) According to still another aspect of the invention, there is provided a method of manufacturing a magnetic recording medium by using the in-line type film forming apparatus according to any one of (1) to (6). The method includes at least: a step of sequentially moving the carrier to the chambers on the transportation path and forming at least an underlying layer on a non-magnetic substrate; a step of moving the carrier to a chamber on a downstream side on the transportation path and forming a magnetic layer by heating the substrate, on which the underlying layer is formed, to a temperature of 350° C. to 700° C.; a step of unloading the substrate, on which film formation up to the magnetic layer is completed, from the carrier, moving the substrate to the inside of the processing chamber, and cooling down the substrate to a temperature of 340° C. to 100° C.; and a step of loading the substrate, which is cooled down in advance to a temperature of 340° C. to 100° C., on the carrier, moving the carrier to a chamber on a downstream side on the transportation path, and forming a hard carbon film on the magnetic layer.

According to the invention, it is possible to provide an in-line type film forming apparatus and a method of manufacturing a magnetic recording medium which are capable of coping with advanced film forming conditions such as performing of a cooling process of a substrate without a decrease in productivity.

DETAILED DESCRIPTION OF THE INVENTION

Hereinafter, configurations of an in-line type film forming apparatus and a method of manufacturing a magnetic recording medium to which the invention is applied will be described with reference to the attached drawings. In addition, for convenience of explanation, the drawings that are used in the following description show a characteristic portion in an enlarged manner for the easy understanding of characteristics, and dimensional ratios of respective constituent elements and the like are not limited to actual values. In addition, materials, dimensions, and the like, which are exemplified in the following description, are illustrative only, and the invention is not limited thereto. Appropriate modifications can be made without changing the gist of the invention.

(In-Line Type Film Forming Apparatus)

Figure 1:
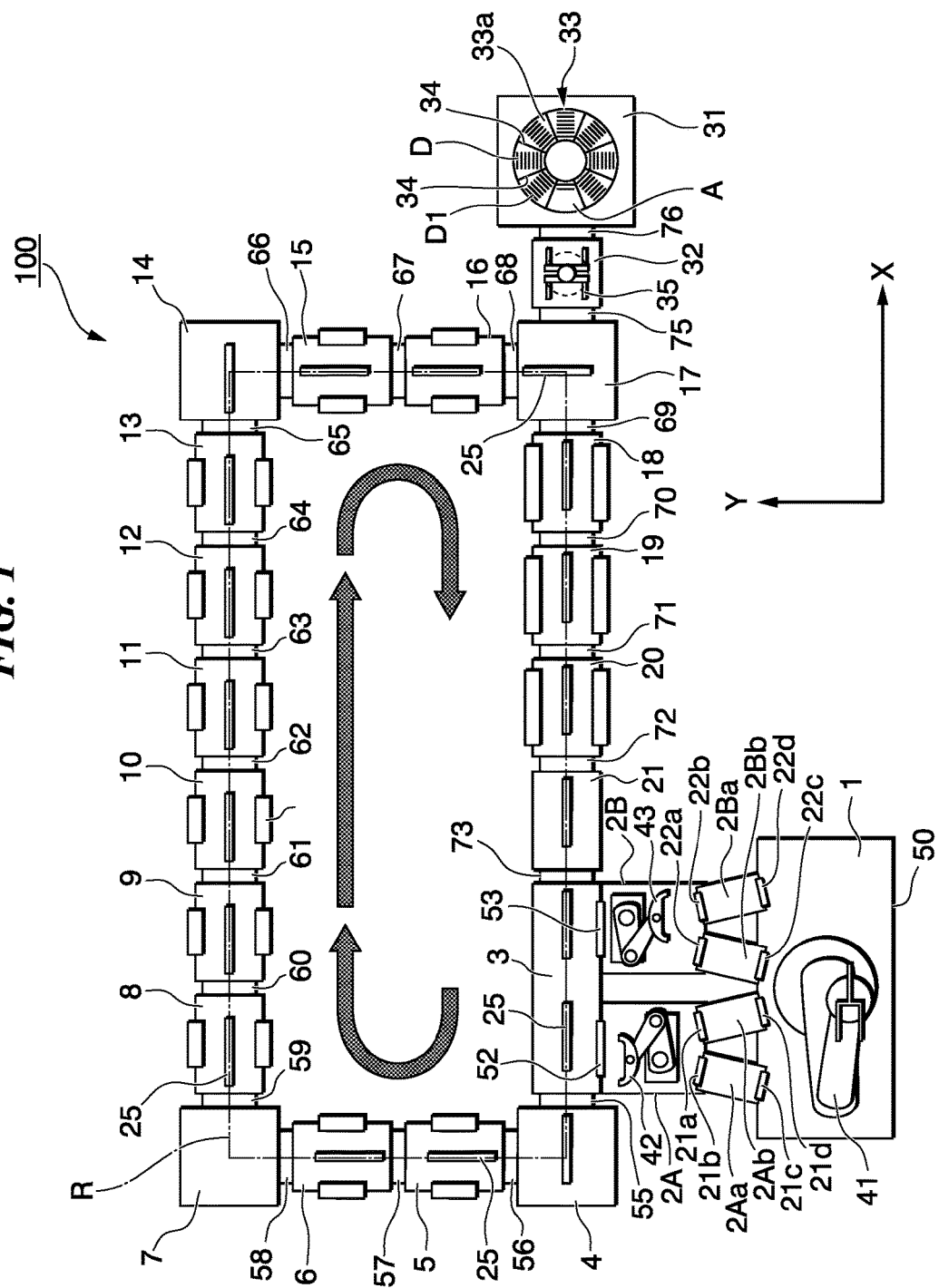
FIG. 1 is a plan view showing a configuration of an in-line type film forming apparatus to which a first embodiment of the invention is applied.
Figure 2:
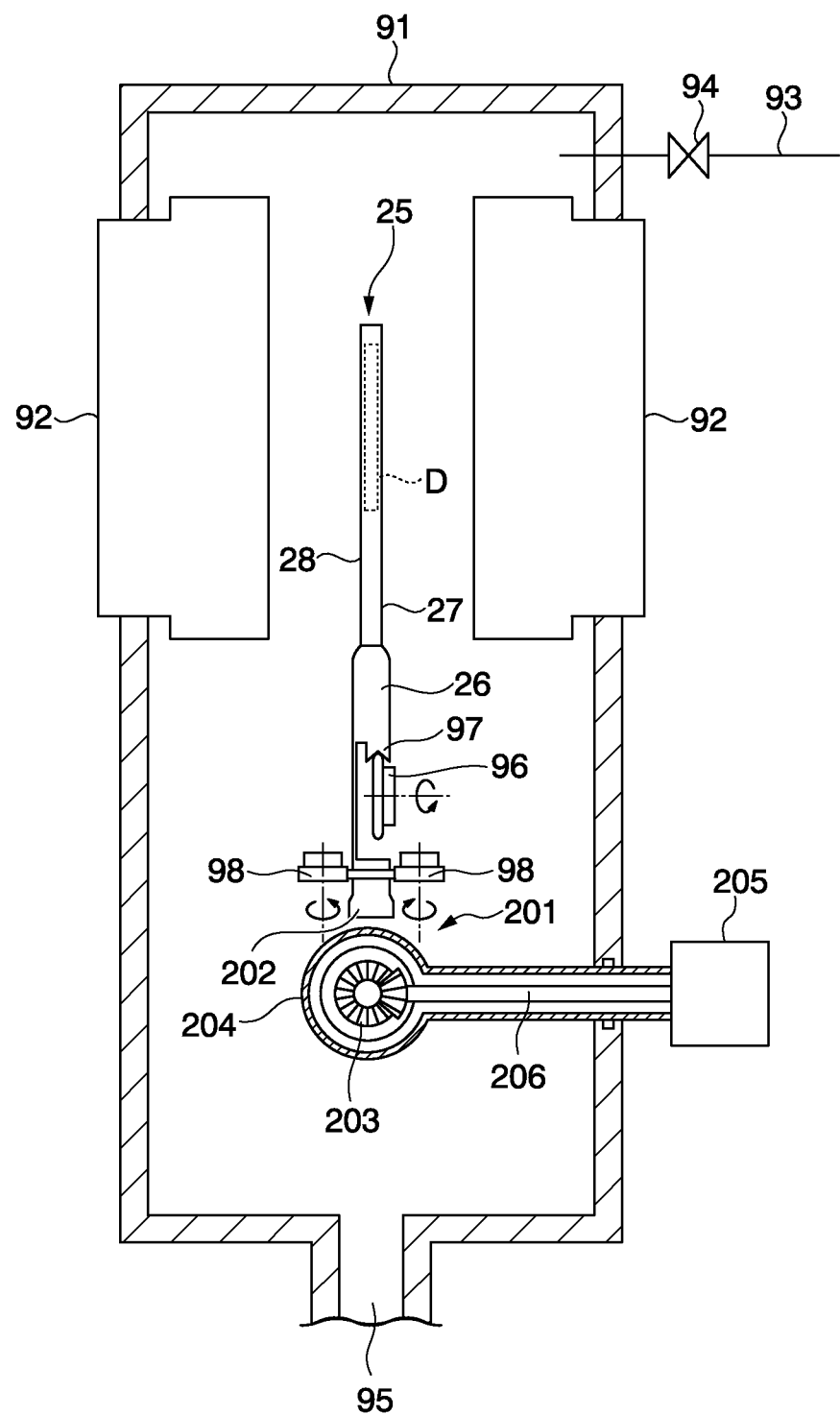
FIG. 2 is a cross-sectional view showing a carrier of the in-line type film forming apparatus to which the first embodiment of the invention is applied.
Figure 3:
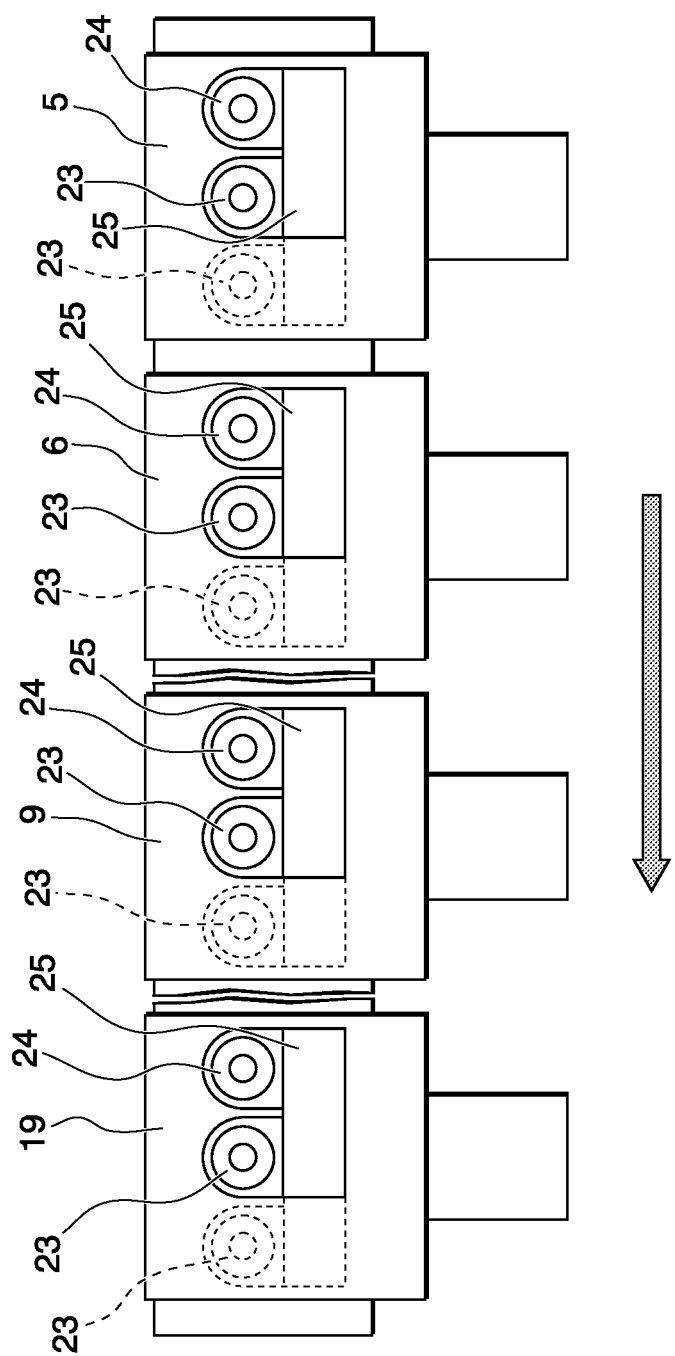
FIG. 3 is a side view showing a part of the in-line type film forming apparatus to which the first embodiment of the invention is applied.
Figure 4:
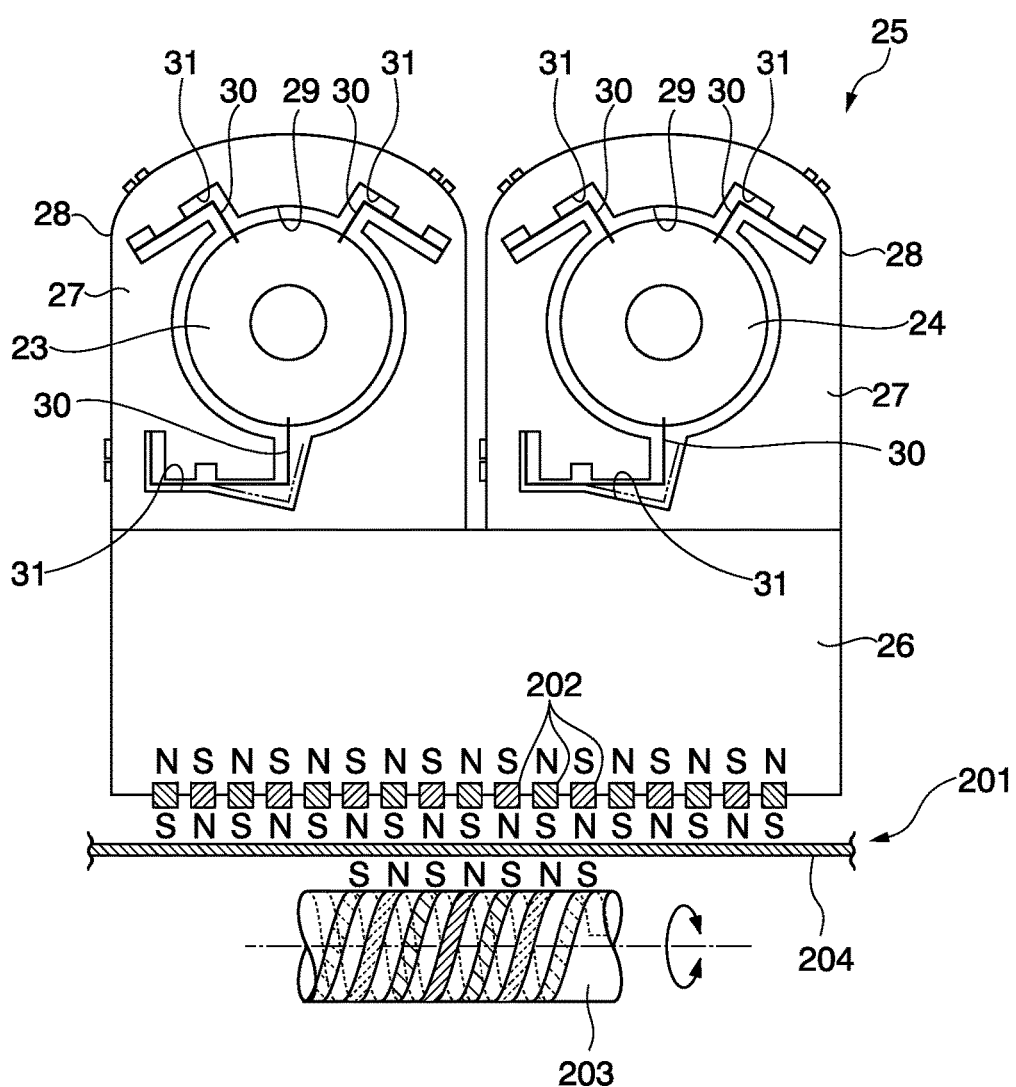
FIG. 4 is a side view showing a part of the in-line type film forming apparatus to which the first embodiment of the invention is applied.

FIG. 1 is a plan view showing a configuration of an example of an in-line type film forming apparatus that is an embodiment of the invention. FIG. 2 is a cross-sectional view showing a carrier in the in-line type film forming apparatus shown in FIG. 1. FIG. 3 is a view showing a part of the in-line type film forming apparatus shown in FIG. 1. FIG. 4 is a side view showing a part of the in-line type film forming apparatus shown in FIG. 1. In this example, a description will be given to a case in which a substrate-cooling vacuum chamber is used as a processing chamber of the invention.

An in-line type film forming apparatus 100 shown in FIG. 1 includes a plurality of chambers 3 to 21 which are connected to each other to form a rectangular closed path and which perform a film forming process and the like, a carrier 25 that holds a substrate as a film forming target inside the plurality of chambers 3 to 21 that are connected to each other, a transportation path R which is provided in the vacuum chambers (chambers) that are connected to each other and which form a closed path, and a transportation mechanism that sequentially transports the carrier 25 along the transportation path R between the plurality of chambers.

In addition, the in-line type film forming apparatus 100 includes a substrate-cooling vacuum chamber (processing chamber) 31 which is disposed to deviate from the closed path and which is connected to the chamber (corner chamber) 17 among the plurality of vacuum chambers through a sub-chamber 32. The substrate-cooling vacuum chamber 31 includes a substrate stock holder 33 capable of accommodating a plurality of substrates, and a cooling unit 34 that cools down substrates accommodated in the substrate stock holder 33.

In addition, the in-line type film forming apparatus 100 includes a first loading and unloading unit 35 which unloads a substrate from the carrier 25, and loads the substrate in the substrate stock holder 33 inside the substrate-cooling vacuum chamber 31, a second loading and unloading unit 35 which unloads the substrate cooled down by the cooling unit 34 in the substrate stock holder 33 inside the substrate-cooling vacuum chamber 31 from the substrate stock holder 33, and loads the substrate on the carrier 25, and a control device (not shown) which performs control of allowing the carrier 25 to sequentially move to downstream side vacuum chambers on the transportation path R, and allowing a film forming process to be performed for the substrate.

Figure 5:
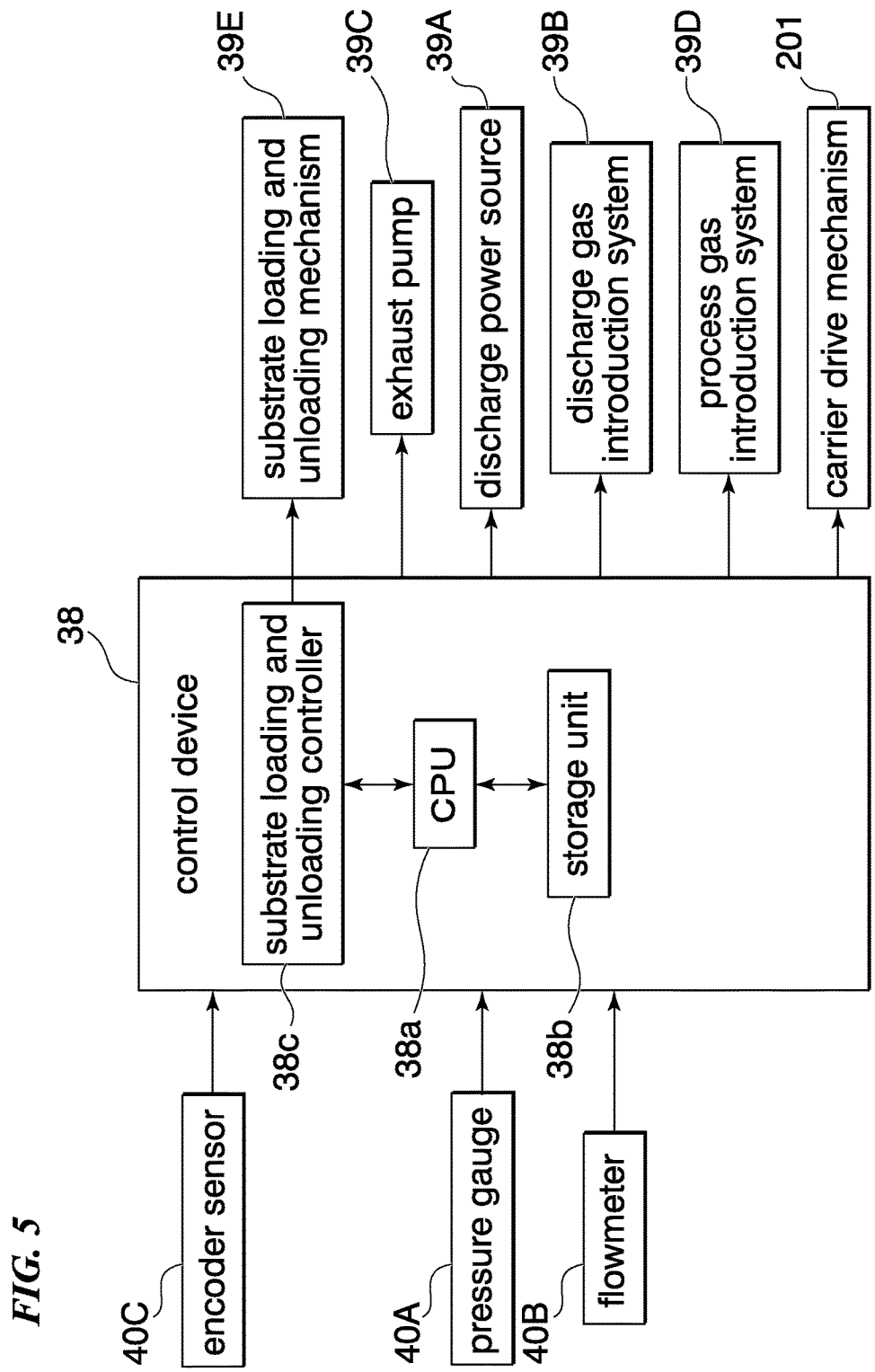
FIG. 5 is a block diagram showing the role of the control device.

Referring now to FIG. 5, a control device 38 that is provided in the in-line type film forming apparatus 100 of this embodiment and controls the respective operation elements accompanying a film forming process is described. FIG. 5 is a block diagram showing the control device 38 and its peripheral elements according to this embodiment.

As shown in FIG. 5, an example of the control device 38 of this embodiment is formed with a conventional personal computer (PC) that includes a CPU 38a, a storage unit 38b such as a ROM and a RAM, for example, and a control unit 38c which controls loading and unloading the substrate D. The CPU 38a can control the above described components and can perform various arithmetic operations in accordance with programs. The storage unit 38b is formed with a ROM that stores various programs and parameters in advance, a RAM that serves as a work area and temporarily stores programs and data, and the like. The control unit 38c has a function of arranging the position and direction of the substrate in accordance with the information detected from the encoder sensor 40C.

The operation of the control device 38 is describes as follows. The control device 38 outputs control commands to a discharge power source 39A, a discharge gas introduction system 39B, an exhaust pump 39C, a process gas introduction system 39D, a loading and unloading mechanism 39E, that loads and unloads the substrate D, a drive mechanism 201, that drives the carrier 25, and the like. In compliance with the commands, various process conditions such as the discharge time, the discharge power, and the process pressure are controlled. The control device 38 is also capable of acquiring output values of various sensors such as a pressure gauge 40A that measures the pressure inside the chamber 3 to 21, 31, and 32, a flowmeter 40B that measures gas flow rates, and the encoder sensor 40C that detects the state of the substrate D. By using the control device 38, it is possible to control each part of the in-line type film forming apparatus 100 in accordance with the state of it.

The algorithm for processing by using the in-line type film forming apparatus 100 according to the present invention is stored as a film formation control program in the storage unit 38b of the control device 38, and is read and executed by the CPU 38a when an operation is started.

The film formation control program is recorded on a PC-readable recording medium, and is installed in the storage unit 38b of the PC. Examples of recording media include magnetic recording media such as floppy (a registered trade name) disks and ZIP (a registered trade name), magneto-optical media such as MO, and optical disks such as CD-R, DVD-R, DVD+R, CD-R, DVD-RAM, DVD+RW (a registered trade name), and an optical disk such as PD. Other examples include flash memories such as compact flash (a registered trade name), Smart Media (a registered trade name), memory sticks (a registered trade name), multimedia cards, and SD memory cards, and removable hard disks such as microdrives (a registered trade name) and Jaz (a registered trade name).

By using the control device, it is possible to control of driving the first and second loading and unloading units 35 to unload the substrate, which is heated and subjected to the film forming process, from the carrier 25 and to load the substrate in the substrate stock holder 33 inside the substrate-cooling vacuum chamber 31, and control of driving the first and second loading and unloading units 35 to unload a substrate, which is cooled down in advance by the cooling unit 34 in the substrate stock holder 33 inside the substrate-cooling vacuum chamber 31, from the substrate stock holder 33 and to load the substrate on the carrier 25.

In the in-line type film forming apparatus 100 shown in FIG. 1, a case in which the first loading and unloading unit and the second loading and unloading unit are configured as the same device is shown as an example. In the following description, the first loading and unloading unit and the second loading and unloading unit of this case are collectively referred to as a substrate loading and unloading unit in some cases.

In the in-line type film forming apparatus 100 shown in FIG. 1, a case in which the processing chamber includes the substrate stock holder is shown as an example, but the in-line film forming apparatus of the invention is not limited thereto. For example, the substrate stock holder may be detachable, or the substrate stock holder may be configured in such a manner that the substrate stock holder is disposed in a chamber different from the processing chamber, and is moved to the processing chamber after the substrate unloaded from the carrier is loaded (in the substrate stock holder).

The in-line type film forming apparatus 100 shown in FIG. 1 includes a robot stage 1, a substrate loading chamber 2A and a substrate unloading chamber 2B which are adjacent to the robot stage 1, substrate loading sub-chambers 2Aa and 2Ab which are connected to the substrate loading chamber 2A, and substrate unloading sub-chambers 2Ba and 2Bb which are connected to the substrate unloading chamber 2B.

In addition, the in-line type film forming apparatus 100 shown in FIG. 1 includes a substrate transfer robot 41 that is placed on the robot stage 1, a substrate loading robot 42 that is disposed inside the substrate loading chamber 2A, and a substrate unloading robot 43 that is disposed inside the substrate unloading chamber 2B.

In addition, gate valves 55 to 73 are provided to connection portions of respective chambers that constitute a closed path, and when the gate valves 55 to 73 are in a closed state, the inside of each of the respective chambers 5, 6, 8 to 13, 15, 16, and 18 to 21 becomes an independently closed space. In addition, the carrier 25 is sequentially transported between the respective chambers by using the following transportation mechanism, and a predetermined film forming unit, a predetermined gas supply unit (not shown), and a predetermined gas discharging unit (not shown) are provided inside the respective chambers. For example, as the film forming unit, a sputtering apparatus can be used. The respective chambers are provided with the gas supply unit and the gas discharging unit, and thus the respective chambers are configured to flow a process gas therethrough as necessary. In addition, respective corner chambers 4, 7, 14, and 17 are chambers that change a movement direction of the carrier 25, and a direction switching unit (not shown) that rotates the carrier 25 and moves the carrier 25 to the next chamber is provided inside the respective corner chambers.

The substrate loading and unloading chamber 3 is disposed between the corner chamber 4 and the chamber 21. A space portion (the inside) of the substrate loading and unloading chamber 3 is provided to be wider than space portions of other chambers, and two carriers 25 capable of loading and unloading a substrate are disposed inside the substrate loading and unloading chamber 3. One carrier 25 performs loading of the substrate and the other carrier 25 performs unloading of the substrate.

At a timing shown in FIG. 1, one carrier 25 is respectively disposed in the chambers 6, 5, and 4, and two carriers 25 are disposed in the chamber 3, and one carrier 25 is respectively disposed in the chambers 21, 20, 19, and 18. As a result, a total of nine carriers 25 are disposed as one group. In addition, one carrier 25 is respectively disposed in the chambers 16, 15, 14, 13, 12, 11, 10, 9, and 8, and thus a total of nine carriers 25 are disposed as another group.

All of the carriers 25 are simultaneously transported in a direction indicated by an arrow in FIG. 1.

The substrate loading chamber 2A and the substrate unloading chamber 2B are connected to the substrate loading and unloading chamber 3 through the gate valves 52 and 53, respectively. The substrate loading chamber 2A is a loading chamber that loads a substrate on the carrier 25 inside the substrate loading and unloading chamber 3 by using the robot 42. In addition, the substrate unloading chamber 2B is a chamber that unloads the substrate from the carrier 25 inside the substrate loading and unloading chamber 3 by using the robot 43.

The substrate transfer robot 41 feeds a substrate D from a cassette, in which the substrate D before forming film is accommodated, to the substrate loading chamber 2A through the substrate loading sub-chambers 2Aa and 2Ab. In addition, the substrate transfer robot 41 takes out the substrate D (magnetic recording medium) after forming film, which is unloaded from the substrate unloading chamber 2B, through the substrate unloading sub-chambers 2Ba and 2Bb.

In addition, in this specification, a non-magnetic substrate and a non-magnetic substrate on which one layer or a plurality of layers are formed are collectively described as the substrate D.

The substrate loading sub-chambers 2Aa and 2Ab are provided with first gate valves 21a and 21b, respectively, on a substrate loading chamber 2A side, and are provided with second gate valves 21c and 21d, respectively, on a robot stage 1 side. Similarly, the substrate unloading sub-chambers 2Ba and 2Bb are provided with first gate valves 22a and 22b, respectively, on a substrate unloading chamber 2B side, and are provided with second gate valves 22c and 22d, respectively, on a robot stage 1 side.

When the first gate valves 21a and 21b are opened, loading or unloading of the substrate D is possible between the substrate loading chamber 2A and the substrate loading sub-chambers 2Aa and 2Ab.

In addition, when the first gate valves 22a and 22b are opened, unloading or loading of the substrate D is possible between the substrate unloading chamber 2B and the substrate unloading sub-chambers 2Ba and 2Bb.

For example, a slide opening and closing type gate valve can be used as the first gate valves 21a, 21b, 22a, and 22b.

In addition, when the second gate valves 21c and 21d are opened, unloading of the substrate D from the substrate loading sub-chambers 2Aa and 2Ab to the outside or loading of the substrate D from the outside to the substrate loading sub-chambers 2Aa and 2Ab is possible.

In addition, when the second gate valves 22c and 22d are opened, unloading of the substrate D from the substrate unloading sub-chambers 2Ba and 2Bb to the outside or loading of the substrate D from the outside to the substrate unloading sub-chambers 2Ba and 2Bb is possible.

Configurations of the respective film forming chambers 5, 6, 8 to 13, 15, 16, and 18 to 21, which perform a film forming process of manufacturing a magnetic recording medium, are substantially the same as each other except for a minor difference according to processing contents. Accordingly, specific configurations of the film forming chambers 5, 6, 8 to 13, 15, 16, and 18 to 21 will be collectively described by using a chamber 91 shown in FIG. 2.

As shown in FIG. 2, two processing devices 92, which perform a film forming process with respect to the substrate D held by the carrier 25, are provided on a side wall of the chamber 91 to face each other with the carrier 25 interposed therebetween.

For example, the two processing devices 92 are configured as follows. In a case of performing the film forming process by using a sputtering method, the two processing devices 92 are configured as a cathode unit that causes sputtering discharge. In a case of performing the film forming process by using a different PVD method, the two processing devices 92 are configured as an ion gun and the like. In a case of performing the film forming process by using a CVD method, the two processing devices 92 are configured as an electrode unit to form a film forming space for the CVD method.

In addition, the respective film forming chambers are provided with a gas introduction tube 93 that introduces a raw material gas or an atmospheric gas to the inside of the respective film forming chambers. In addition, the gas introduction tube 93 is provided with a valve 94 whose opening and closing are controlled by a control mechanism (not shown). A gas supply from the gas introduction tube 93 is controlled according to an opening and closing operation of the valve 94.

In addition, a gas discharging tube 95, which is connected to each vacuum pump (not shown), is provided to the respective film forming chambers. In addition, the chamber 91 can evacuate the inside thereof through the gas discharging tube 95 that is connected to the vacuum pump.

As shown in FIGS. 3 and 4, the carrier 25 includes a supporting stage 26, and a plurality of holders 27 that are provided on an upper surface of the supporting stage 26. In addition, in this embodiment, the carrier 25 has a configuration in which two holders 27 are mounted on the stage 26. Two sheets of the substrates D that are held by the holder 27 are defined as a first film forming substrate 23 and a second film forming substrate 24, respectively.

In addition, in this embodiment, for example, in a state in which the carrier 25 is stopped at a first processing position indicated by a solid line in FIG. 3, the two processing devices 92 can perform a film forming process and the like with respect to both surfaces of the first film forming substrate 23 on a left side of the carrier 25. Then, the carrier 25 moves to a second processing position indicated by a broken line in FIG. 3. In a state in which the carrier 25 is stopped at the second processing position, the two processing devices 92 can perform the film forming process and the like with respect to both surfaces of the second film forming substrate 24 on a right side of the carrier 25.

In addition, in a case where four processing devices 92, which face the first and second film forming substrates 23 and 24, respectively, are provided on both sides with the carrier 25 interposed therebetween, the movement of the carrier 25 becomes unnecessary. Accordingly, the film forming process and the like can be simultaneously performed with respect to the first and second film forming substrates 23 and 24 that are held by the carrier 25.

The two holders 27 are provided in parallel with each other on the upper surface of the supporting stage 26 in such a state that the first and second film forming substrates 23 and 24 are held in a vertically mounted state (a state in which main surfaces of the substrates 23 and 24 become parallel with the gravity direction), that is, the main surfaces of the first and second film forming substrates 23 and 24 are on the approximately same plane and approximately perpendicular to the upper surface of the supporting stage 26.

The respective holders 27 are configured in such a manner that a circular hole 29 having a diameter slightly larger than the outer periphery of the film forming substrates 23 and 24 is formed in a plate body 28 having a thickness one time to several times the thickness of the first and second film forming substrates 23 and 24.

In addition, a plurality of supporting members 30 are provided at the periphery of the hole 29 of each of the respective holders 27 in an elastically deformable manner. Three supporting members 30 are provided at the periphery of the hole 29 of the holder 27 with a constant interval in order to support an outer peripheral portion of each of the first and second film forming substrates 23 and 24, which are disposed on an inner side of the hole 29, at three points including a lower side point which is located at the lowermost position on the outer periphery, and a pair of upper side points which is located on an upper side of the outer periphery and which is symmetrical to a central line along the gravity direction passing through the lower side position.

According to this, the carrier 25 can hold each of the first and second film forming substrates 23 and 24, which are interposed to an inner side of the supporting members 30, to the holder 27 in a detachable manner while bringing the outer peripheral portion of each of the first and second film forming substrates 23 and 24 into contact with the three supporting members 30. In addition, attachment and detachment of each of the first and second film forming substrates 23 and 24 to and from each of the holders 27 are performed when the substrate loading robot 42 and the substrate unloading robot 43 downwardly press the supporting member 30 on the lower position side.

As shown in FIG. 4, each of the respective supporting members 30 are constituted by a spring member that is bent in an L shape, and is disposed in a slit 31 formed at the periphery of the hole 29 of the holder 27 in a state in which a base end side of the supporting member 30 is fixed and supported to the holder 27, and a front end side of the supporting member 30 protrudes toward an inner side of the hole 29. In addition, although not being shown, a V-shaped groove with which the outer peripheral portion of each of the first and second film forming substrates 23 and 24 engages is provided to the front end portion of the supporting member 30.

As shown in FIG. 4, the in-line type film forming apparatus includes a drive mechanism 201, which drives the carrier 25 without contacting with the carrier 25, as a transportation device that transports the carrier 25.

The drive mechanism 201 includes a plurality of magnets 202 at a lower portion of the carrier 25. The plurality of magnets 202 are disposed in such a manner that an N pole and an S pole are alternately arranged. That is, the plurality of magnets 202 are disposed in such a manner that a magnet that is magnetized toward the carrier 25 side and a magnet that is magnetized toward a side opposite to the carrier 25 are alternately arranged along a transportation direction of the carrier 25.

In addition, the drive mechanism 201 includes a rotary magnet 203 on a lower side of the plurality of magnets 202. In the rotary magnet 203, a plurality of spiral magnetization regions are provided at an equal interval on a side wall (outer peripheral surface) of a columnar member. Adjacent magnetization regions have different magnetisms each other. An N pole and an S pole are alternately arranged on an outer peripheral surface of the rotary magnet 203 in a double spiral shape. A rotational axis of the rotary magnet 203 is parallel with the transportation direction of the carrier 25.

In addition, a vacuum partition 204 is interposed between the plurality of magnets 202 and the rotary magnet 203. The vacuum partition 204 is formed from a material having high permeability to make the plurality of magnets 202 and the rotary magnet 203 be magnetically coupled each other. In addition, the vacuum partition 204 surrounds the periphery of the rotary magnet 203 to separate an inner side of the chamber 91 and the air side from each other.

In addition, the rotary magnet 203 is connected to a rotary shaft 206, which is rotatably driven by a rotary motor 205, through a plurality of gears that engage with each other. Accordingly to this, a driving force transmitted from the rotary motor 205 can be transmitted to the rotary magnet 203 through the rotary shaft 206, and the rotary magnet 203 can rotate around its axial direction.

The drive mechanism 201 configured as described above rotates the rotary magnet 203 around its axial direction while magnetically coupling the magnet 202 on a carrier 25 side and the rotary magnet 203 in a non-contact manner, thereby linearly drives the carrier 25 along the axial direction of the rotary magnet 203.

In addition, in the chamber 91, a plurality of main bearings 96, which are supported to rotate in the horizontal axis direction, are provided and arranged in the transportation direction of the carrier 25 as a guide mechanism guiding the carrier 25 that is transported. On the other hand, the carrier 25 includes a guide rail 97, with which the plurality of main bearings 96 engage, on a lower portion side of the supporting stage 26. In the guide rail 97, a V-shaped groove is formed along a longitudinal direction of the supporting stage 26.

In addition, a pair of sub-bearings 98, which is supported to rotate around the vertical axis direction, is provided inside the chamber 91 with the carrier 25 interposed therebetween. As is the case with the plurality of main bearings 96, a plurality of the pairs of sub-bearings 98 are provided and arranged in the transportation direction of the carrier 25.

In addition, the main bearings 96 and the sub-bearings 98 are bearings that reduce friction between mechanical components to secure a smooth rotational movement of a machine. Specifically, the main bearings 96 and the sub-bearings 98 are constituted by a rolling bearing, and are rotatably attached to a spindle (not shown in FIG. 2) fixed to a frame (attachment member) that is provided inside the chamber 91.

In a state in which the plurality of main bearings 96 engage with the guide rail 97, the carrier 25 moves on the plurality of main bearings 96, and the carrier 25 is interposed between the pair of sub-bearings 98, and thus the carrier 25 is prevented from being inclined.

In the in-line type film forming apparatus 100, the substrate-cooling chamber 31 is connected to the corner chamber 17 through the sub-chamber 32. Gate valves 75 and 76 are provided at a connection portion between the corner chamber 17 and the sub-chamber 32 and a connection portion between the sub-chamber 32 and the substrate-cooling chamber 31, respectively.

In the in-line type film forming apparatus 100, the substrate-cooling chamber 31 is connected to the corner chamber 17 through the sub-chamber 32, but the substrate-cooling vacuum chamber 31 may be configured to be directly connected to the corner chamber 17 without through the sub-chamber 32. In this case, it is necessary to provide first and second loading and unloading units 35 inside the corner chamber 17 or inside the substrate-cooling chamber 31.

The substrate-cooling chamber 31 includes the substrate stock holder 33 that can accommodate a plurality of the substrates D, and the cooling unit 34 that cools down the substrates D that are accommodated in the substrate stock holder 33. For example, a method, in which heat of the substrates D is transmitted to the cooling unit 34 through the substrate stock holder 33 to radiate the heat, may be considered. In this case, it is preferable that the substrate stock holder 33 be formed from a copper alloy or an aluminum alloy which has high thermal conductivity.

The substrate stock holder 33 includes a rotary table 33a that is configured to intermittently rotate around a central axis of a drive motor (not shown) by driving the drive motor, and a substrate supporting unit (not shown) that supports the substrates D. The substrate supporting unit is configured in such a manner that the substrates D can be radially disposed at a predetermined angle toward the center of the rotary table in a vertical state in respective substrate disposition regions on the rotary table 33a which are partitioned by the cooling unit (cooling plate) 34.

The substrate stock holder 33 shown in FIG. 1 has a rotary type configuration, but there is no limitation to the rotary type configuration. For example, a slide type configuration in which the substrate stock holder 33 linearly moves may be used.

The cooling unit 34 includes a plurality of cooling plates that are provided on the rotary table 33a with an equal interval in a circumferential direction. In an example shown in FIG. 1, eight sheets of cooling plates are provided, and the substrates D are loaded between the cooling plates. In an example shown in FIG. 1, the substrates D are loaded at portions other than a site indicated by a symbol A. For example, the cooling unit 34 is manufactured with a copper plate having high thermal conductivity, and may have a configuration in which a coolant circulating pipe is provided inside the cooling unit 34, and the pipe is connected to a coolant supply source.

The cooling unit 34 shown in FIG. 1 is obtained by using the cooling plates. However, there is no limitation thereto, and a known cooling unit may be used. The cooling unit 34 may have a configuration in which a cooling plate is disposed between respective substrates to cool down the substrates from both surfaces of the substrates.

The sub-chamber 32 includes a substrate loading and unloading robot as the substrate loading and unloading unit 35, which performs loading of the substrate on the carrier 25 disposed inside the corner chamber 17 and unloading of the substrate from the carrier 25 disposed inside the chamber 17. In the in-line type film forming apparatus 100 shown in FIG. 1, the first and second loading and unloading units 35 are provided inside the sub-chamber 32. However, the first and second loading and unloading units 35 may be provided inside the corner chamber 17 or the substrate-cooling vacuum chamber 31. As the substrate loading and unloading robot, a multi-joint robot having an arm may be used. In this case, the substrate loading and unloading robot is configured to hold one sheet of substrate D or a plurality of sheets of substrate D from the carrier 25 disposed inside the corner chamber 17 by using the arm, and to load the one sheet of substrate D or the plurality of sheets of substrate D on the substrate stock holder 33 inside the substrate-cooling chamber 31.

With regard to an operation of the in-line type film forming apparatus 100 shown in FIG. 1, an operation during manufacturing of the thermally assisted magnetic recording medium will be described as an example.

An adhesive layer, a heat sink layer, and an underlayer are sequentially formed on a non-magnetic substrate while sequentially transporting the carrier 25, to which the substrate D is held, through a plurality of vacuum chambers 5, 6 and 8 to 13. Next, a process of forming a magnetic layer is performed. In the magnetic layer forming process, the substrate D, on which film formation up to the underlayer is performed, is heated to a temperature of 350° C. to 700° C. while moving the carrier 25, which holds the substrate D, through the vacuum chambers 15 and 16. Next, the following control is performed. The carrier 25 is moved from the vacuum chamber 16 to the corner chamber (connection corner chamber) 17, and the substrate loading and unloading unit 35 is driven to unload the substrate D, on which film formation up to the magnetic layer is completed by the heating, from the carrier 25 inside the connection corner chamber 17, and to load the substrate D in the substrate supporting unit (site indicated by A in FIG. 1), in which the substrate D is not accommodated, of the substrate stock holder 33 inside the substrate-cooling vacuum chamber 31. In addition, the substrate loading and unloading unit 35 is driven to unload a substrate D (for example, a substrate D1 shown in FIG. 1), which is cooled down in advance to a temperature of 340° C. to 100° C. by the cooling unit 34 in the substrate stock holder 33 inside the substrate-cooling vacuum chamber 31, from the substrate stock holder 33, and to load the substrate D on the carrier 25 inside the connection corner chamber 17 that is empty. Then, a direction of the carrier 25 is switched by using the direction switching unit inside the connection corner chamber 17, and the carrier 25 is sequentially moved to the vacuum chambers 18 to 21 so as to perform subsequent film forming processes, thereby continuously manufacturing the thermally assisted magnetic recording medium.

The substrate D, which is moved to the substrate stock holder 33 of the substrate-cooling vacuum chamber 31 is cooled down by the cooling unit 34, and is taken out by the substrate loading and unloading unit 35 to be loaded on the carrier 25 inside the connection corner chamber 17. Then, the subsequent film forming process is performed, whereby the substrate D is manufactured as the thermally assisted magnetic recording medium.

In the in-line type film forming apparatus 100 of an embodiment of the invention, the plurality of vacuum chambers, which perform the film forming process, are connected in a closed path shape, and the substrate-cooling vacuum chamber is disposed to deviate from the closed path. In addition, cooling of the substrate is performed by the substrate-cooling vacuum chamber, and a substrate, which is cooled down in advance, is moved to the vacuum chambers that are disposed on the closed path. Accordingly, the film forming process can be continued. According to this, it is possible to continue the film forming process without a rate-limitation by the cooling process during manufacturing of the magnetic recording medium, and thus it is possible to avoid a decrease in productivity due to performing of the cooling process.

In addition, the in-line type film forming apparatus 100 has a configuration in which the substrate is unloaded from the carrier and is cooled down, and thus it is possible to cool down only a disk without the cooling-down of the carrier. As a result, it is possible to suppress a decrease in holding power during manufacturing.

In addition, the in-line type film forming apparatus 100 employs a configuration in which the cooled-down substrate is held inside the substrate-cooling vacuum chamber, and thus the substrate does not come into contact with the air. Accordingly, attachment of contamination such as moisture and oxygen to the substrate is avoided.

In addition, the in-line type film forming apparatus 100 is configured in such a manner that the substrate-cooling vacuum chamber 31 is connected to the corner chamber. The corner chamber is a chamber that performs direction switching of the carrier, and is not a chamber that performs the film forming process. Accordingly, there is a small effect due to a loss of time in accordance with unloading of the substrate from the carrier in the corner chamber, movement of the substrate from the corner chamber to the substrate-cooling vacuum chamber, movement of the cooled-down substrate from the substrate-cooling vacuum chamber to the corner chamber, and loading of the cooled-down substrate on the carrier in the corner chamber.

Figure 6:
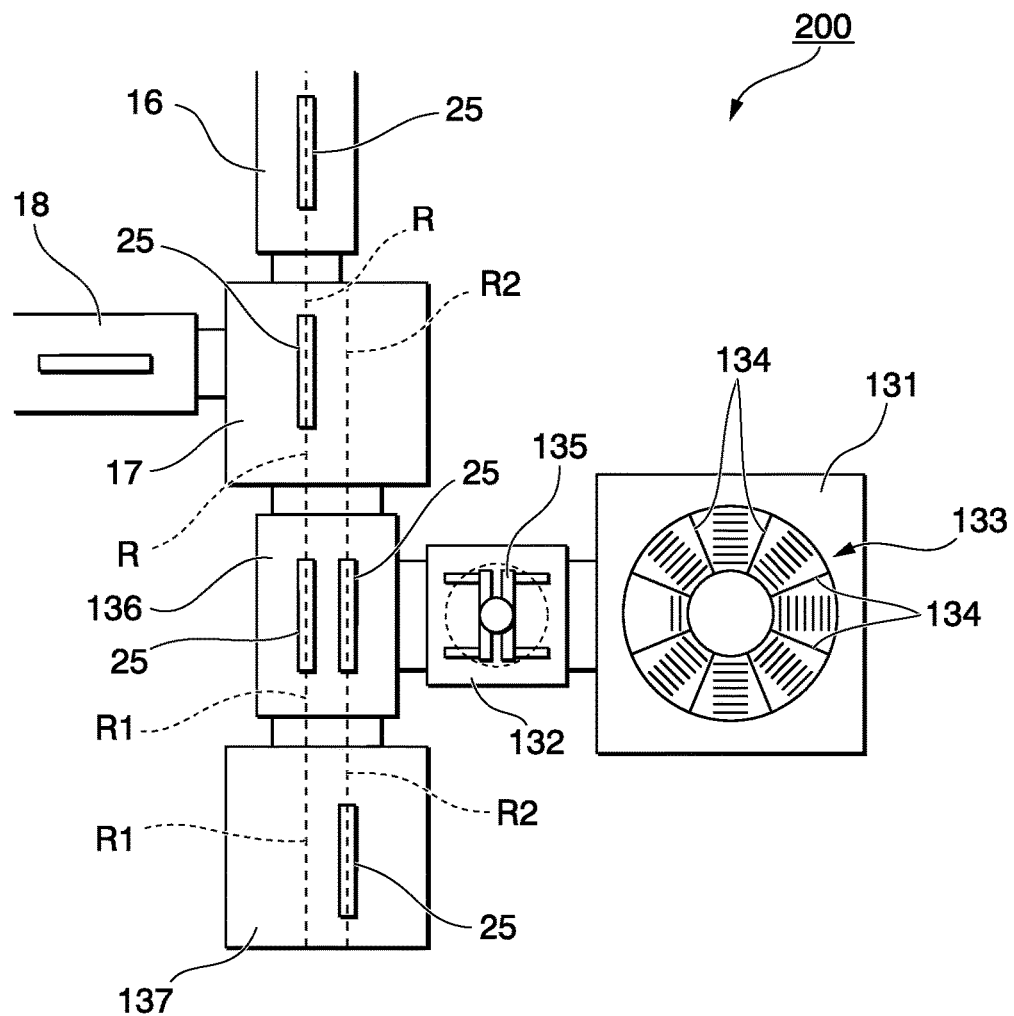
FIG. 6 is a plan view showing a part of a configuration of an in-line type film forming apparatus to which a second embodiment of the invention is applied.

FIG. 6 is a schematic view showing an example of an in-line type film forming apparatus according to another embodiment, and mainly shows only portions different from that of the embodiment shown in FIG. 1. In this embodiment, a description will also be given to a case in which the substrate-cooling vacuum chamber is used as the processing chamber of the invention.

In an in-line type film forming apparatus 200 of another embodiment, a substrate-cooling vacuum chamber (processing chamber) 131 is connected to the corner chamber (connection corner chamber) 17 through a sub-vacuum chamber (sub-chamber) 136 and a vacuum chamber 132 provided with a substrate loading and unloading unit 135. The sub-vacuum chamber 136 includes an extended transportation path R1 that is extended from the transportation path R in the corner chamber 17. In addition, the corner chamber 17 and the sub-vacuum chamber 136 include an auxiliary transportation path R2 provided in parallel with the extended transportation path R1.

A control device has a control function of driving the substrate loading and unloading unit 135 to unload a substrate from a carrier 25 disposed on the auxiliary transportation path R2 and to load the unloaded substrate in a substrate stock holder 133 inside the substrate-cooling vacuum chamber 131, and to load a substrate D, which is cooled down in advance by using a cooling unit 134 in the substrate stock holder 133 inside the substrate-cooling vacuum chamber 131, on the carrier 25 disposed on the auxiliary transportation path R2. A device shown in FIG. 5 can be used as the control device.

The in-line type film forming apparatus 200 shown in FIG. 6 further includes a second sub-vacuum chamber 137, but the second sub-vacuum chamber 137 may not be provided.

A gate valve is provided to a connection portion between the substrate-cooling vacuum chamber 131 and the vacuum chamber 132, a connection portion between the connection corner chamber 17 and the sub-vacuum chamber 136, and a connection portion between the sub-vacuum chamber 136 and the second sub-vacuum chamber 137.

A structure and an operation of the in-line type film forming apparatus 200 shown in FIG. 6 will be described in more detail.

The in-line type film forming apparatus 200 further includes the second sub-vacuum chamber 137, and the second sub-vacuum chamber 137 includes the extended transportation path R1 and the auxiliary transportation path R2.

An operation of the in-line type film forming apparatus 200 before and after a process of cooling the substrate D will be described.

A magnetic layer forming process of heating a substrate, on which film formation up to the underlying layer is performed, to a temperature of 350° C. to 700° C. to form a magnetic layer is performed, and then the carrier 25, which holds the substrate on which the film formation up to the underlying layer is performed, is moved from the vacuum chamber 16 to the corner chamber 17 along the transportation path R. Next, the carrier 25 is moved to the auxiliary transportation path R2 from the transportation path R in the corner chamber 17. Next, the carrier 25 is moved from the corner chamber 17 to the sub-vacuum chamber 136 along the auxiliary transportation path R2. Next, the substrate D held by the carrier 25 that is moved to the auxiliary transportation path R2 inside the sub-vacuum chamber 136 is unloaded from the carrier 25 by using the substrate loading and unloading unit 135 inside the vacuum chamber 132 and is loaded in the substrate stock holder 133 inside the substrate-cooling vacuum chamber 131. Next, a substrate D, which is cooled down in advance in the substrate-cooling vacuum chamber 131, is unloaded from the substrate stock holder 133 by using the substrate loading and unloading unit 135, and is loaded on the carrier 25 which is empty and is disposed on the auxiliary transportation path R2 inside the sub-vacuum chamber 136. Next, the carrier 25 that holds the cooled-down substrate D is moved from the sub-vacuum chamber 136 to the second sub-vacuum chamber 137 along the auxiliary transportation path R2. Next, the carrier 25 is moved from the auxiliary transportation path R2 to the extended transportation path R1 in the second sub-vacuum chamber 137. Next, the carrier 25 is sequentially moved to the second sub-vacuum chamber 137 and the sub-vacuum chamber 136 along the extended transportation path R1, and is further moved to the transportation path R of the corner chamber 17. A direction of the carrier that is moved to the transportation path R of the corner chamber 17 is switched by the direction switching mechanism to move the carrier 25 to the vacuum chamber 18. In the vacuum chamber 18, the subsequent film forming process is performed with respect to the substrate D that is held by the carrier 25.

In the meantime the carrier 25 is moved to the corner chamber 17, the sub-vacuum chamber 136, the second sub-vacuum chamber 137, and the sub-vacuum chamber 136, and returns to the corner chamber 17 while holding a substrate D that is cooled down in advance, a carrier 25, which is proceeding in advance in synchronization with the above-described movement, moves in the same manner and returns to the corner chamber 17 while holding a substrate D that is cooled down in advance, and moves to the subsequent vacuum chamber 18. In the vacuum chamber 18, the subsequent film forming process is performed with respect to the substrate D that is held by the carrier 25.

When the carrier 25, which holds the substrate on which film formation up to the underlying layer is performed, is moved from the corner chamber 17 and returns to the corner chamber 17 while holding the substrate D that is cooled down in advance, in contrast, the carrier 25, which holds the substrate on which film formation up to the underlying layer is performed, may be sequentially moved from the transportation path R of the corner chamber 17 to the sub-vacuum chamber 136 and the second sub-vacuum chamber 137 on the extended transportation path R1, may be moved from the extended transportation path R1 to the auxiliary transportation path R2 in the second sub-vacuum chamber 137, and may be moved to the second sub-vacuum chamber 137, the sub-vacuum chamber 136, and the corner chamber 17 on the auxiliary transportation path R2.

In the in-line type film forming apparatus 200 of an embodiment of the invention, the plurality of vacuum chambers, which perform the film forming process, include a substrate-cooling vacuum chamber which is connected in a closed path shape, and the substrate-cooling vacuum chamber is disposed to deviate from the closed path. In addition, cooling of the substrate is performed by the substrate-cooling vacuum chamber, and a substrate, which is cooled down in advance, is moved to the vacuum chambers that are disposed on the closed path. Accordingly, the film forming process can be continued. According to this, it is possible to continue the film forming process without a rate-limitation by the cooling process during manufacturing of the magnetic recording medium, and thus it is possible to avoid a decrease in productivity due to performing of the cooling process.

In addition, the in-line type film forming apparatus 200 has configuration in which the substrate is unloaded from the carrier and is cooled down, and thus it is possible to cool down only a disk without the cooling-down of the carrier. As a result, it is possible to suppress a decrease in holding power during manufacturing.

In addition, the in-line type film forming apparatus 200 employs a configuration in which the cooled-down substrate is held inside the substrate-cooling vacuum chamber, and thus the substrate does not come into contact with the air. Accordingly, attachment of contamination such as moisture and oxygen to the substrate is avoided.

In addition, the in-line type film forming apparatus 200 is configured in such a manner that the substrate-cooling vacuum chamber 31 is connected to the corner chamber. The corner chamber is a chamber that performs direction switching of the carrier, and is not a chamber that performs the film forming process. Accordingly, a small effect, that is due to a loss of time in accordance with unloading of the substrate from the carrier in the corner chamber, movement of the substrate from the corner chamber to the substrate-cooling vacuum chamber, and movement of the cooled-down substrate from the substrate-cooling vacuum chamber to the corner chamber, is small.

In the in-line type film forming apparatus 200, a chamber (sub-vacuum chamber 136), which performs a substrate switching operation of taking out a substrate on which film formation up to the underlying layer is performed or returning a substrate that is cooled down in advance, is disposed to deviate from the transportation path R in which the film forming process is performed. According to this, the film forming process can be progressed during a substrate switching operation.

Figure 7:
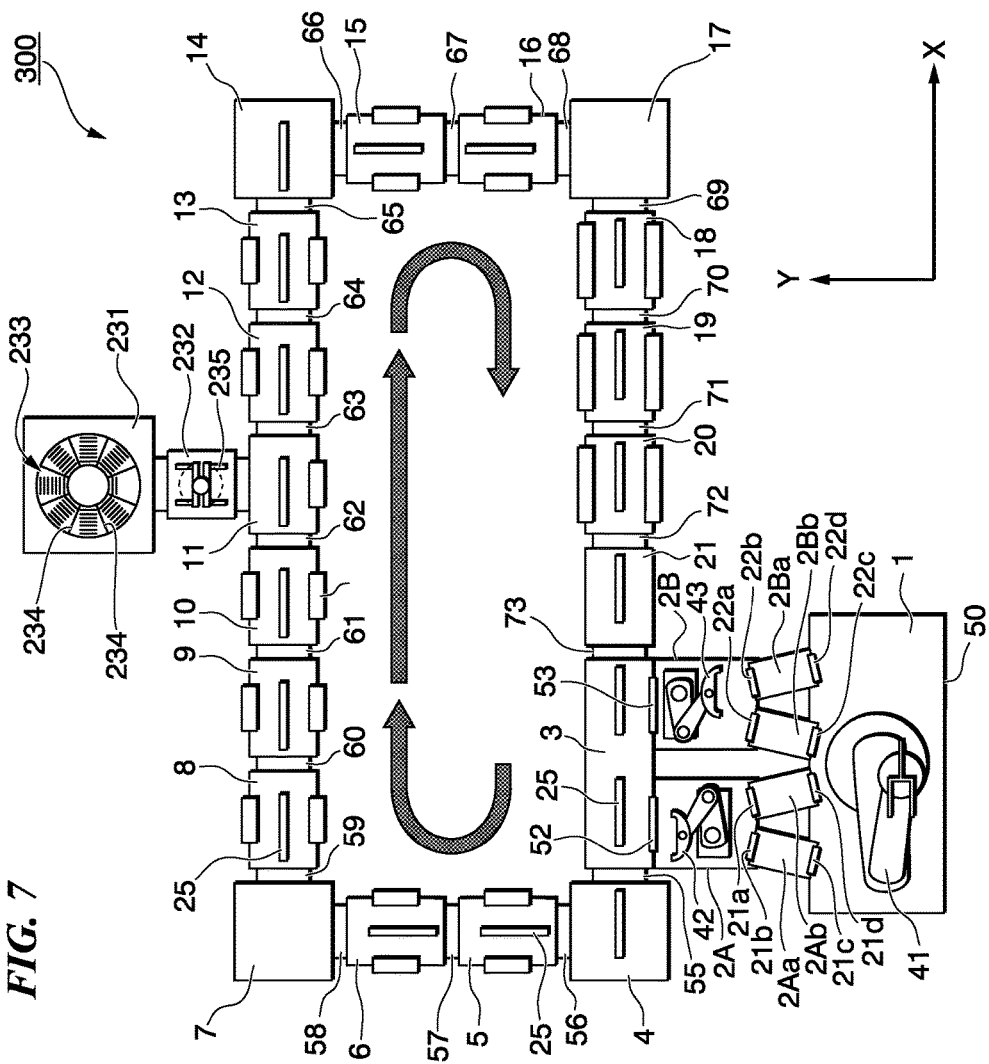
FIG. 7 is a plan view showing a configuration of an in-line type film forming apparatus to which a third embodiment of the invention is applied.

FIG. 7 is a schematic view showing an example of an in-line type film forming apparatus according to still another embodiment of the invention, and mainly shows only portions different from that of the embodiment shown in FIG. 1. In this example, a description will also be given to a case in which the substrate-cooling vacuum chamber is used as the processing chamber of the invention.

In an in-line type film forming apparatus 300 in an embodiment of the invention, a substrate-cooling vacuum chamber (processing chamber) 231 is connected to the vacuum chamber 11, which is disposed between the corner chambers 7 and 14 disposed at corners of the rectangular closed path, through a vacuum chamber 232 provided with a substrate loading and unloading unit 235. The control device performs control of driving the substrate loading and unloading unit 235 to unload a substrate D, on which film formation up to a magnetic layer is completed by heating, from the carrier, and to load the substrate D in a substrate stock holder 233 inside the substrate-cooling vacuum chamber 231 so as to cool down the substrate D by a cooling unit 234. In addition, the control device performs control of driving the substrate loading and unloading unit 235 to unload a substrate D, which is cooled down in advance by the cooling unit 234 in the substrate stock holder 233 inside the substrate-cooling vacuum chamber 231, from the substrate stock holder 233, and to load the substrate D on the carrier 25. A device shown in FIG. 5 can be used as the control device.

A main operation of the in-line type film forming apparatus 300 shown in FIG. 7 is common to the in-line type film forming apparatus 100, and thus a description thereof will not be repeated.

In the in-line type film forming apparatus 300 of this embodiment, the plurality of vacuum chambers, which perform the film forming process, are connected in a closed path shape, and the substrate-cooling vacuum chamber is disposed to deviate from the closed path. Cooling of the substrate is performed by the substrate-cooling vacuum chamber, and a substrate, which is cooled down in advance, is moved to the vacuum chambers that are disposed on the closed path. Accordingly, the film forming process can be continued. According to this, it is possible to continue the film forming process without a rate-limitation by the cooling process during manufacturing of the magnetic recording medium, and thus it is possible to avoid a decrease in productivity due to the cooling process.

In addition, the in-line type film forming apparatus 300 has configuration in which the substrate is unloaded from the carrier and is cooled down, and thus it is possible to cool down only a disk without the cooling-down of the carrier. As a result, it is possible to suppress a decrease in holding power during manufacturing.

In addition, the in-line type film forming apparatus 300 employs a configuration in which the cooled-down substrate is held inside the substrate-cooling vacuum chamber, and thus the substrate does not come into contact with the air. Accordingly, contamination of the substrate with, for example, moisture and oxygen, is avoided.

In the above-described in-line type film forming apparatus, the substrate-cooling vacuum chamber is connected to the vacuum chambers on the transportation path through the sub-vacuum chamber, but the substrate-cooling vacuum chamber may be directly connected to the vacuum chambers without going through the sub-vacuum chamber.

In addition, the vacuum chambers on the transportation path, to which the substrate-cooling vacuum chamber is directly or indirectly connected, may be configured in such a manner that two carriers can be disposed similar to the substrate loading and unloading chamber 3. In this case, as is the case with the substrate loading chamber 2A and the substrate unloading chamber 2B, each vacuum chamber may be configured to include two sub-vacuum chambers with a substrate loading and unloading unit.

Hereinbefore, the in-line type film forming apparatus of an embodiment of the invention has been described with reference to an example in which the substrate-cooling vacuum chamber is used as the processing chamber, but the processing chamber of the invention is not limited thereto. For example, the processing chamber may be applied to a vacuum annealing chamber for substrates, a vacuum cold-removal chamber for substrates, and the like in which long processing time is necessary. According to this, it is possible to provide an in-line type film forming apparatus and a method of manufacturing a magnetic recording medium which are capable of coping with advanced film forming conditions and which are suitable for mass production.

(Method of Manufacturing Magnetic Recording Medium)

A description will be given to an example of an embodiment of a method of manufacturing a magnetic recording medium by using the in-line type film forming apparatus according to the invention.

First, a description will be given to a thermally assisted magnetic recording medium that can be manufactured according to the method of manufacturing a magnetic recording medium of the invention.

(Thermally Assisted Magnetic Recording Medium)

Figure 8:
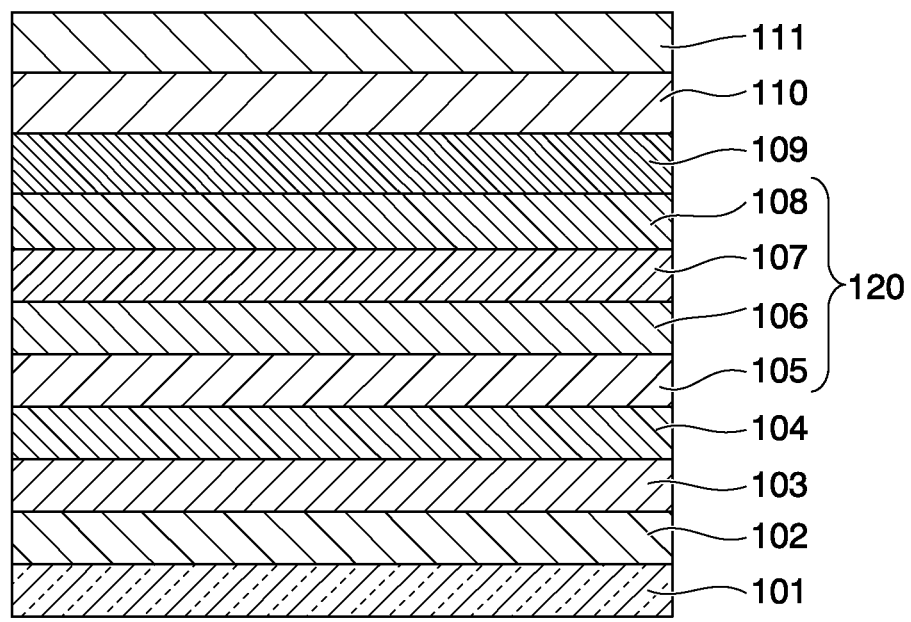
FIG. 8 is a cross-sectional view showing an example of a thermally assisted magnetic recording medium that can be manufactured by a method of manufacturing a magnetic recording medium by using the in-line type film forming apparatus of the invention.

FIG. 8 is a cross-sectional view showing an example of the thermally assisted magnetic recording medium.

The thermally assisted magnetic recording medium shown in FIG. 8 has a configuration in which an adhesive layer 102, a heat sink layer 103, a seed layer 104, an underlayer 120, a magnetic layer 109, a protective film 110, and a lubricant layer 111 are sequentially laminated on a substrate 101. In the thermally assisted magnetic recording medium shown in FIG. 8, the underlayer 120 is constituted by a first underlying layer 105, a second underlying layer 106, a third underlying layer 107, and an upper underlayer 108 having a NaCl crystal structure.

(Substrate)

As the substrate 101 that is used in the thermally assisted magnetic recording medium, a circular non-magnetic substrate and the like may be used. As the non-magnetic substrate, for example, glass, aluminum, ceramics, and the like may be used, and as the glass substrate, for example, crystallized glass, amorphous glass, reinforced glass, and the like may be used.

As the substrate 101 that is used in the thermally assisted magnetic recording medium, it is preferable to use a substrate which has a high glass transition point and which is excellent in heat resistance. Surface roughness, heat capacity, a crystallization state, and the like may be appropriately selected in accordance with film forming conditions of respective layers that are formed on the substrate 101, use conditions of the magnetic recording medium, and the like.

(Adhesive Layer)

The adhesive layer 102 is provided to improve adhesiveness between the heat sink layer 103 and the substrate 101. A material that constitutes the adhesive layer 102 is not particularly limited as long as the material is excellent in adhesiveness and surface flatness, and examples of the material include CrTi, NiTa, AlTi, CoTi, NiTaZr, and the like.

(Heat Sink Layer)

The heat sink layer 103 is provided to diffuse heat collected to the magnetic layer 109 in a vertical direction (thickness direction) so as to suppress spreading of the heat in a horizontal direction, thereby narrowing a transition width. In addition, the heat sink layer 103 is provided to rapidly scatter the heat collected to the magnetic layer 109 after recording, and is provided as necessary. Examples of a material that constitutes the heat sink layer 103 include Ag, Al, Cu, W, Mo, alloys which contain these elements as a main component and have high heat conductivity, and the like.

(Seed Layer)

The seed layer 104 in FIG. 8 is a layer provided to cancel a (111) orientation of the heat sink layer 103 that is formed immediately below the seed layer 104 and to allow the first underlying layer 105 to have a good (100) orientation. Examples of a material that constitutes the seed layer 104 include amorphous materials such as CrTi, NiTa, and AlTi. In addition, a soft magnetic material may be used for the seed layer 104. In addition, in a case where the first underlying layer 105 of the magnetic recording medium has the (100) orientation and and exhibits a sufficient orientation property, the seed layer 104 may not be provided.

(First Underlayer)

The first underlying layer 105 is formed as a layer that controls the grain size and the orientation of the underlying layers 106, 107, and 108, and the magnetic layer 109 on an upper side of the first underlying layer 105. The first underlying layer 105 has a lattice constant "a" satisfying a relationship of 2.87 Å=a<3.04 Å (0.287 nm≤a<0.304 nm), and has a B2 structure or a BCC structure that contains Cr as a main component.

For example, the first underlying layer 105 is formed from Cr, or an alloy which contains Cr as a main component and contains at least one kind of element selected from Ti, V, Mo, W, Nb, Ta, Mn, and Ru. According to this, the second underlying layer 106 on the first underlying layer 105 exhibits the good (100) orientation due to epitaxial growth.

In addition, the main component represents that the corresponding component is contained, for example, in an amount of 50 at % or more (or more than 50 at %).

Specifically, the first underlying layer 105 with the (100) orientation can be formed by applying a method in which a Cr alloy film is formed on the substrate 101 that is heated, for example, to approximately 250° C. It is preferable that the thickness of the first underlayer 105 be 2 nm or more to form the good (100) orientation.

(Second Underlayer)

The second underlying layer 106 has a lattice constant "a" satisfying a relationship of 3.04 Å≤a<3.18 Å (0.304 nm≤a<0.318 nm), and has a BCC structure.

Examples of a constituent material of the second underlying layer 106 include Cr, Mo, Nb, Ta, V, W, and compounds which contain these elements as a main component and which contain at least one kind of elements selected from Cr, Ti, V, Mo, W, Nb, Ta, Mn, and Ru.

The second underlying layer 106 is a layer provided to relax lattice mismatching between the first underlying layer 105 and the third underlying layer 107, and to improve the (100) orientation of the third underlying layer 107. According to this, a lattice constant of the second underlying layer 106 corresponds to an intermediate value between the lattice constant of the first underlying layer 105 and a lattice constant of the third underlying layer 107. It is preferable that the thickness of the second underlying layer 106 be 2 nm or more to form the satisfactory (100) orientation.

(Third Underlayer)

The third underlying layer 107 has a lattice constant "a" satisfying a relationship of 3.18 Å≤a<3.31 Å (0.318 nm≤a<0.331 nm), and has a BCC structure. Examples of a constituent material of the third underlying layer 107 include, Cr, Mo, Nb, Ta, V, W, and compounds which contain these elements as a main component and which contain at least one kind of element selected from Cr, Ti, V, Mo, W, Nb, Ta, Mn, and Ru.

The third underlying layer 107 allows a NaCl-type underlying layer on an upper side of the third underlying layer 107 to have the excellent (100) orientation, and introduces an appropriate in-plane stress to the NaCl-type underlying layer. When a lattice constant of the third underlying layer 107 is made to be large to introduce the in-plane stress to the NaCl-type underlying layer, it is possible to improve SNR. As a value of the lattice constant with which lattice mismatching with the second underlying layer 106 does not increase and which can introduce an appropriate stress to the NaCl-type underlying layer, a range of 3.18 Å≤a<3.31 Å is employed.

(Upper Underlayer)

As an upper underlying layer 108 that is formed on the third underlying layer 107, for example, a material having a NaCl structure may be used. Specifically, examples of the material include oxides such as MgO, TiO, and NiO, nitrides such as TiN, TaN, NbN, and HfN, and carbides such as TaC and TiC.

Since the third underlying layer 107 exhibits the (100) orientation, the upper underlying layer 108 having the NaCl structure also exhibits the (100) orientation by epitaxial growth. Accordingly, when a magnetic layer 109, which contains a FePt alloy or a CoPt alloy as a main component and has an $L1_0$ crystal structure, is formed on the upper underlying layer 108 having the NaCl structure, it is possible to allow the magnetic layer 109 to have a satisfactory (001) orientation.

A soft magnetic underlying layer may be formed to improve a recording characteristic of the thermally assisted magnetic recording medium.

When the soft magnetic underlying layer is formed, it is possible to increase a gradient of magnetic field that is applied to the magnetic layer 109. Accordingly, when being provided to a magnetic recording and reproducing apparatus, it is possible to efficiently apply a magnetic field from a magnetic head to the magnetic layer 109.

The magnetic layer 109 may be formed from a material that contains an alloy having an $L1_0$-type crystal structure as a main component. To achieve a high recording density, it is preferable that the magnetic layer 109 be formed from magnetic particles which are separated from each other by a grain boundary segregation material which have a particle size of several nm. However, a volume of the magnetic particles decreases, and thus the magnetic layer 109 becomes thermally unstable. Therefore, an alloy having the $L1_0$-type crystal structure, in which magnetic anisotropy energy is high, may be used as a main component of the magnetic layer 109.

It is preferable that the magnetic layer 109 contain an FePt alloy or a CoPt alloy, which has the $L1_0$ crystal structure, as a main component, and at least one kind of oxide or element selected from $SiO_2$, $TiO_2$, $Cr_2O_3$, $Al_2O_3$, $Ta_2O_5$, $ZrO_2$, $Y_2O_3$, $CeO_2$, MnO, TiO, ZnO, and C.

To further improve the recording characteristic of the thermally assisted magnetic recording medium, a cap layer may be formed on the magnetic layer 109. As the cap layer, an alloy containing Co, Fe, and Ni as a main component may be used. The cap layer may contain other additive elements in a range not losing ferromagnetism at room temperature. As the cap layer, a crystalline alloy or an amorphous alloy may be used.

(Protective Film)

It is preferable that the protective film 110 be formed from a material excellent in heat resistance, and a single-layer or multi-layer carbon film, and the like may be used. As the carbon film, a material to which hydrogen, nitrogen, or a metal is added may be used. The carbon film can be formed in accordance with a CVD method or an ion beam method.

(Lubricant Layer)

As the lubricant layer 111, a liquid lubricant layer composed of perfluoropolyether, and the like may be used.

(Method of Manufacturing Thermally Assisted Magnetic Recording Medium)

As an example of a method of manufacturing a magnetic recording medium according to the invention, a method of manufacturing a thermally assisted magnetic recording medium by using the in-line type film forming apparatus 100 will be described. A method of manufacturing the thermally assisted magnetic recording medium shown in FIG. 8 will be described.

The following processes are performed while sequentially transporting the substrate D, which is held by the carrier 25, between the plurality of vacuum chambers 5, 6, 8 to 13, 15, 16, 31, and 18 to 21 by using the in-line type film forming apparatus 100.

First, the adhesive layer 102, the heat sink layer 103, and the seed layer 104 are sequentially formed on the non-magnetic substrate 101, and an under layer forming process is performed. In the process of forming underlayer, a substrate D, on which film formation up to the seed layer 104 is performed, is heated preferably in a range of 200° C. to 300° C. to form the underlying layer 120 on the seed layer 104.

Next, the carrier 25 is moved to a vacuum chamber on a downstream side on the transportation path R, and the substrate, on which the underlying layer is formed, is heated preferably in a range of 350° C. to 700° C. to form the magnetic layer 109. Next, the carrier 25 is moved to the corner chamber 17, and the substrate D on which film formation up to the magnetic layer 109 is completed is unloaded from the carrier 25. Then, the substrate D is moved to the inside of the substrate-cooling vacuum chamber 31, and the substrate D is cooled down to a temperature preferably in a range of 340° C. to 100° C. In addition, a substrate, which is cooled down in advance to a range of 340° C. to 100° C. and on which film formation up to the magnetic layer is completed, is taken out from the substrate-cooling chamber 31, and is loaded on the carrier 25 from which the substrate is unloaded and which is empty. The carrier 25 is moved to the vacuum chambers 18 to 21 on a downstream side, and the protective film 110, which is formed from diamond like carbon (DLC), is formed on the substrate on which film formation up to the magnetic layer is performed. Next, the lubricant layer 111 is formed on the protective film 110, thereby obtaining the thermally assisted magnetic recording medium.

As another example of the method of manufacturing the magnetic recording medium of the invention, a method of manufacturing a magnetic recording medium by using the in-line type film forming apparatus 100 will be described.

At least the following processes are performed by using the in-line type film forming apparatus 100. Specifically, a process of forming at least a multi-layer on a non-magnetic substrate while sequentially transporting the substrate D, which is held by the carrier 25, between a plurality of the vacuum chambers 5, 6, 8 to 13, 15, 16, 31, and 18 to 21 is performed. In addition, before the multi-layer film forming process, after the multi-layer film forming process, or during the multi-layer film forming process, a process of unloading the substrate from the carrier and moving the substrate to the inside of the processing chamber (substrate-cooling vacuum chamber) to process the substrate in the processing chamber is performed.

In the method of manufacturing the magnetic recording medium to which the invention is applied, the above-described in-line type film forming apparatus is used, and thus it is possible to manufacture a thermally assisted magnetic recording medium with high quality without a decrease in productivity due to the cooling process.

According to the invention, it is possible to provide an in-line type film forming apparatus and a method of manufacturing a magnetic recording medium which are capable of coping with advanced film forming conditions.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

REFERENCE SIGNS LIST 4, 7, 14, 17: corner chamber
25: carrier
31, 131, 231: processing chamber
32, 132, 232: sub-chamber
33, 133, 233: substrate stock holder
34, 134, 234: cooling unit
35, 135, 235: substrate loading and unloading unit (first loading and unloading unit, second loading and unloading unit)
136: sub-chamber
100, 200, 300: in-line type film forming apparatus
D: substrate
R: transportation path
R1: extended transportation path
R2: auxiliary transportation path

What is claimed is:

1. An in-line type film forming apparatus, comprising:
a plurality of chambers which are connected to form a closed path and perform a film forming process;
a carrier which holds a substrate which is a film forming target, in the connected chambers;
a substrate loading robot used before film forming, which loads the substrate not subjected to film forming process on the carrier, and a substrate unloading robot used after film forming, which unloads the substrate subjected to film forming process from the carrier, provided in the same closed path;
a transportation path which forms a closed path provided inside the connected chambers;
a transportation device which sequentially transports the carrier between the plurality of chambers along the transportation path;
a processing chamber which is disposed to deviate from the closed path, which is directly or indirectly connected to any chamber of the plurality of chambers, which does not include the carrier inside, and which processes the substrate;
a loading and unloading unit which unloads the substrate from the carrier, and moves the substrate to the inside of the processing chamber and which takes out the substrate processed in the processing chamber from the processing chamber, loads the substrate on the carrier in the same closed path;
a control device which performs control of allowing the carrier to sequentially move to chambers on a downstream side on the transportation path, and allowing a film forming process to be performed with respect to the substrate;
a stock holder capable of accommodating a plurality of substrates provided in the processing chamber;
wherein the control device drives the loading and unloading unit to unload the substrate from the carrier and to move the substrate to the inside of the processing chamber, and drives the loading and unloading unit to take out the substrate, which is processed in advance in the processing chamber, from the processing chamber and to load the substrate on the carrier in the same closed path;
wherein the stock holder is configured by accommodating the substrate during processing;
wherein the closed path has a rectangular shape, and the processing chamber is directly or indirectly connected to a connection corner chamber which is a corner chamber disposed at a corner of the rectangular closed path;
wherein the processing chamber is connected to the connection corner chamber through a sub-chamber,
the sub-chamber includes an extended transportation path which is extended from the transportation path in the connection corner chamber, the connection corner chamber and the sub-chamber include an auxiliary transportation path which is provided in parallel with the extended transportation path, and the control device drives the loading and unloading unit to unload the substrate from the carrier disposed on the extended transportation path or the auxiliary transportation path, and to move the substrate to the inside of the processing chamber, and drives the loading and unloading unit to load the substrate processed in advance in the processing chamber on the carrier disposed on one of the extended transportation path and the auxiliary transportation path, wherein the substrate loading robot used before film forming, the substrate unloading robot and the loading and unloading unit are separately provided.

2. The in-line type film forming apparatus according to claim 1, wherein the processing chamber includes a cooling unit which cools down the substrate.

3. The-inline type film forming apparatus according to claim 1, wherein the loading and unloading unit comprises a robot which unloads the substrate from the carrier and moves the substrate to the inside of the processing chamber, and which takes out the processed substrate from the processing chamber and loads the substrate on the carrier.

4. The in-line type film forming apparatus according to claim 1, wherein the closed path has a rectangular shape, and the processing chamber is directly or indirectly connected to a chamber that is disposed between corner chambers disposed at corners of the rectangular closed path.

5. A method of manufacturing a magnetic recording medium by using the in-line type film forming apparatus according to claim 1, the method comprising, at least:

a step of sequentially moving the carrier to the chambers on the transportation path, and forming a multi-layer film on a non-magnetic substrate; and a step of unloading the substrate from the carrier before the formation of the multi-layer film, after the formation of the multi-layer film, or during the formation of the multi-layer film, moving the substrate to the processing chamber, and processing the substrate in the processing chamber.

6. A method of manufacturing a magnetic recording medium by using the in-line type film forming apparatus according to claim 1, comprising, at least:

a step of sequentially moving the carrier to the chambers on the transportation path and forming at least an underlying layer on a non-magnetic substrate;

a step of moving the carrier to a chamber on a downstream side on the transportation path and forming a magnetic layer by heating the substrate, on which the underlying layer is formed, to a temperature of 350° C. to 700° C.;

a step of unloading the substrate, on which film formation up to the magnetic layer is completed, from the carrier, moving the substrate to the inside of the processing chamber, and cooling down the substrate to a temperature of 340° C. to 100° C.; and a step of loading the substrate, which is cooled down in advance to a temperature of 340° C. to 100° C., on the carrier, moving the carrier to a chamber on a downstream side on the transportation path, and forming a hard carbon film on the magnetic layer.

* * * * *